United States Patent [19]

Lang, Jr. et al.

[11] 4,109,197
[45] Aug. 22, 1978

[54] PRF DETECTION SYSTEM AND METHOD

[75] Inventors: Milton R. Lang, Jr., Catonsville; William A. O'Berry, Severna Park, both of Md.

[73] Assignee: Westinghouse Electric Corp., Pittsburgh, Pa.

[21] Appl. No.: 341,646

[22] Filed: Mar. 15, 1973

[51] Int. Cl.² ........................................... G01R 23/02
[52] U.S. Cl. ............................ 324/78 F; 307/233 R; 324/78 R; 343/17.1 PF
[58] Field of Search ......... 343/18 E, 17.1 PF, 17.1 R; 324/78 F, 78 R; 307/233

[56] References Cited

U.S. PATENT DOCUMENTS

| 3,278,936 | 10/1966 | Wolf | 343/18 E |
|---|---|---|---|
| 3,299,295 | 1/1967 | Goda | 307/233 |
| 3,437,940 | 4/1969 | Tarczy-Hornoch | 307/233 |
| 3,484,704 | 12/1969 | Hungerford | 307/233 |
| 3,518,555 | 6/1970 | Konotchick, Jr. | 307/233 |
| 3,546,600 | 12/1970 | Riesgo | 307/233 |
| 3,609,396 | 9/1971 | Gassmann | 307/233 |
| 3,714,654 | 1/1973 | Wicks et al. | 343/18 E |
| 3,758,856 | 9/1973 | Fromm | 343/18 E |

Primary Examiner—Maynard R. Wilbur
Assistant Examiner—Richard E. Berger
Attorney, Agent, or Firm—R. M. Trepp

[57] ABSTRACT

A pulse repetition frequency (PRF) detection system is provided for indicating the existence of pulse trains having predetermined repetition frequencies in a composite signal containing pulse trains of different pulse repetition frequencies. The system includes a plurality of independent sorters to which the composite signal is sequentially applied. Each of the sorters is operable to detect a pulse train having a predetermined pulse repetition frequency, to indicate the detection, and to produce pulses for inhibiting or blocking the application of the corresponding pulses of the composite signal on a pulse-by-pulse basis. The sorters may be arranged and interconnected in a decreasing order of frequency detection whereby the signal applied to each successive sorter has all higher frequency detected pulse trains removed therefrom.

11 Claims, 2 Drawing Figures

PRF DETECTION SYSTEM AND METHOD

BACKGROUND OF THE INVENTION

1. Field of the Invention

This invention relates to pulse repetition frequency detection systems and more particularly to a sequential processing system utilizing independent sorters for indicating the presence of pulse trains having predetermined pulse repetition frequencies.

2. State of the Prior Art

The detection and identification of a particular pulse train in a multiple pulse train environment may present difficulties, particularly in the field of electronic countermeasures (ECM) where countermeasures are to be employed against "enemy" radars tracking a target, e.g., by the transmission of jamming signals from the target. For instance, when pulsed radar systems are used to track a target, these radars may be jammed by the transmission of pulse trains having pulse repetition frequencies (PRF's) or rates at or near the PRF of the tracking radar. In such instances it is important for the tracked target to rapidly recognize the PRF of an incoming radar signal so that an appropriate signal can be generated. In a typical situation when a number of radars are tracking a target or are operating in the immediate vicinity, the composite signal received by the target may contain a large number of pulse trains at different PRF's and it is therefore desirable that the PRF's of the incoming signals be quickly determined so that signals from "enemy" radars can be recognized as such and appropriate countermeasures taken.

The detection of a pulse train having a particular PRF is particularly difficult in a multiple pulse train environment, i.e., with incoming signals having differing PRF's. Moreover, even if a signal having only one pulse train is detected, ascertaining the PRF thereof is difficult because of the wide range of possible PRF's encountered. The recognition of and the sorting out of the various pulse trains in a composite signal is also important in ascertaining the source of detected radar signals, i.e., to identify the signals as coming from "friendly" radars which may be safely ignored.

Sorting of the type described requires stable and rapid measurement to enable the employment of effective countermeasures. In all such systems an optimum balance must be maintained between detection probabilities and false alarm rates such that "friendly" pulse trains are eliminated from consideration, leaving a good probability of detection of "enemy" pulse trains.

Another problem with prior art ECM equipment is operator confusion due to "pulse summing" or the overlapping of pulses such that two or more pulses appear to the detection apparatus as a single pulse. Pulse summing may result in false or inaccurate indications of pulse train repetition frequency.

Additionally, there may be a problem of false alarms being generated at certain PRF harmonics of the pulse trains detected. When a large number of pulses are present, conventional parallel processing and masking techniques often fail to distinguish between the fundamental signal and lower harmonics. For instance, if the incoming signal is one in which 100 pulses per second are present, conventional processing equipment responding to 50 pulses per second may indicate the presence of a 50 pulse per second signal, thus giving a false indication of the PRF of the incoming signal.

Previously known systems for handling multiple pulse trains may include systems employing shift registers and/or special purpose computers. These systems may exhibit stability problems and thus result in high false alarm rates. Moreover, common clocking may result in cross-talk or other interference between the various elements of the detecting system reducing the system reliability.

In addition, prior art systems generally do not provide an easy method of locking out or inhibiting the indication of predetermined pulse trains such as those which are transmitted by "friendly" radars. Moreover, systems of the prior art do not generally provide for narrow band inhibiting which may be necessary when "friendly" and "enemy" radars are operating at nearly the same PRF's or at integrally related PRF's.

A further problem with generally known systems for detecting pulse trains having predetermined pulse repetition frequencies is the "look" time of the detecting apparatus, i.e., the amount of time required to detect a particular PRF. If a large number of pulses in the incoming composite signal are required for detection purposes, a significant amount of time may be lost in the processing of the composite signal and the detection apparatus may not be able to track the incoming signals. By rapidly varying the PRF of an "enemy" radar signal faster than these changes in PRF could be followed by the PRF detection apparatus, it is possible to counter efforts to jam an "enemy" signal.

The "look" time of the system may also be described as being the time during which the detection apparatus is active such that a real time output signal is obtainable. In known systems utilizing computer processing, a computer must search through its memory to ascertain the existence or nonexistence of a particular pulse train and the delay in searching the memory may be unacceptable under normal operating conditions.

OBJECTS AND SUMMARY OF THE INVENTION

It is accordingly an object of this invention to obviate many of the deficiencies of the prior art by providing a novel method and apparatus for detecting pulse repetition frequencies in a multiple pulse train environment. In the novel method and apparatus of the present invention, false alarm rates are reduced, harmonic and summed pulse train rejection is increased, and pulse trains are identified with a minimum blanking of desired pulse trains to thereby increase "look" time.

It is another object of this invention to provide a novel method and PRF detection system in which the indication of pulse trains having predetermined PRF's may be easily locked out or inhibited.

It is still another object of the present invention to provide a novel method and PRF detection system having an increased "look" time with a minimum of cross-talk.

It is yet another object of the present invention to provide a novel method and PRF detection system which is modular in form and easily adjusted for PRF selection by the operator of the apparatus.

It is a further object of the present invention to provide a novel method and PRF system having independent sorters with pulse blanking capabilities.

These and other objects and advantages are accomplished in accordance with the present invention by providing independent sorters, each tuned or responsive to a different PRF. Each of the sorters produces an output pulse each time a pulse from a pulse train of the predetermined PRF is applied thereto on a pulse-by-pulse basis. These output pulses may be utilized to indicate the detection of that PRF unless the indication is locked out to prevent clutter of the operator's display.

The sorters may be arranged and interconnected to sequentially detect pulse trains of decreasing pulse repetition frequency so that the signal applied to each of the independent sorters is devoid of pulses in previously detected pulse trains. This is accomplished by pulse blanking or inhibiting in which the output pulse from the immediately preceding sorter is utilized to remove the pulse in the composite input signal to which it is responsive. False alarms due to harmonic detection may be reduced by this arrangement of the sorters in a decreasing frequency order.

More particularly, a method is provided for indicating the existence of pulse trains of predetermined PRF's in a composite signal by providing a plurality of independent PRF detecting means and applying the composite signal in succession to each of the detecting means with pulses of the detected PRF removed from the composite signal on a pulse-by-pulse basis. As a result the "off" or blanked time for succeeding detecting means is very short, thereby maintaining a high degree of "on" time for each of the detecting means and thus a long "look" time for the system as a whole.

Each of the detecting means may be provided with means for inhibiting or locking out the indication therefrom to eliminate operator confusion without interfering with the other PRF detecting means. The apparatus may also operate to detect the pulse repetition rates of incoming signals and automatically tune jamming equipment.

DETAILED DESCRIPTION

Figure 1:
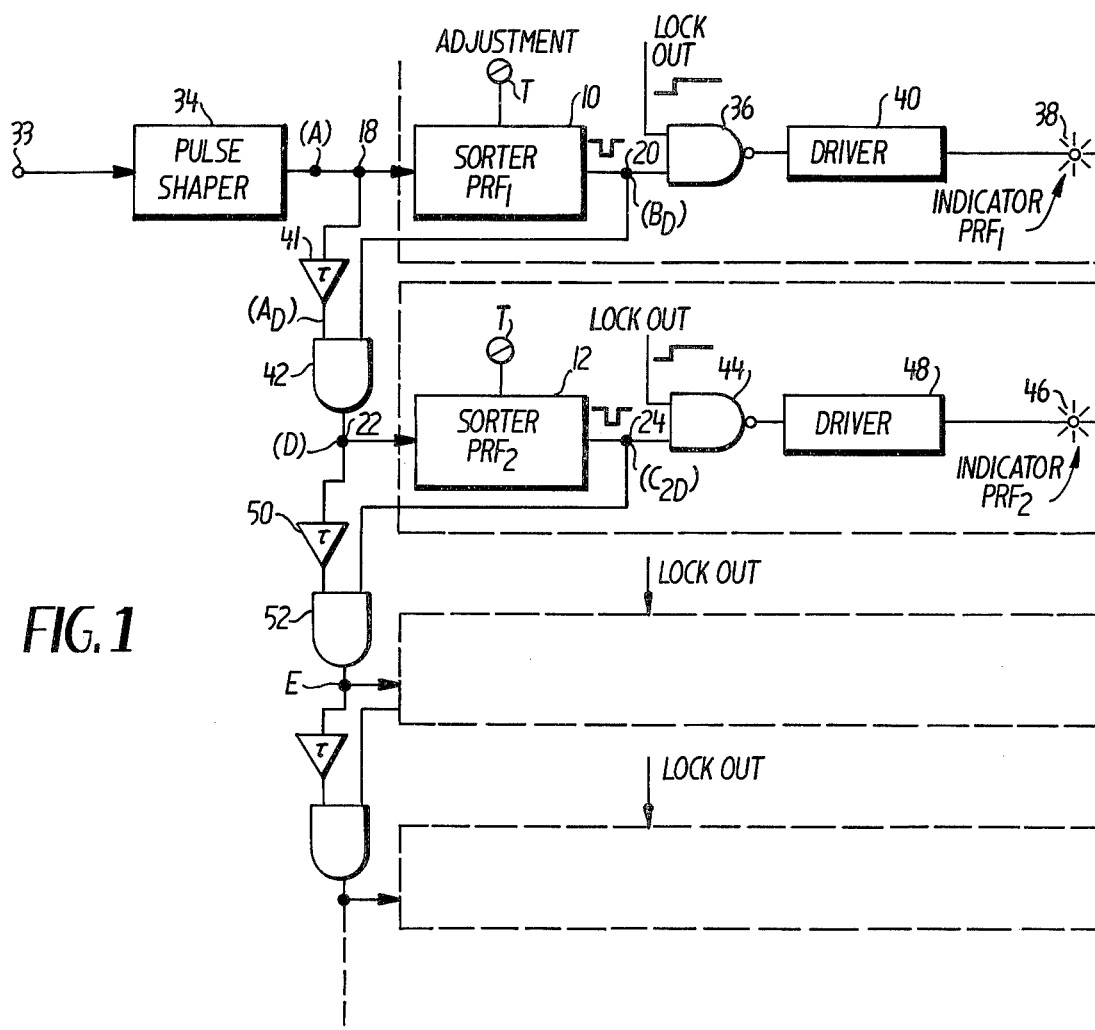
FIG. 1 is a simplified block diagram of a multiple pulse train PRF detection system; and, FIG. 2 is a waveform diagram for signals occurring at various points in the system of FIG. 1.

Referring now to FIG. 1, a multiple pulse repetition frequency (PRF) detection system may include a plurality or sorters 10 and 12 of the type described and claimed in the patent application Ser. No. 812,634, filed Apr. 2, 1969, now U.S. Pat. No. 3,999,136, and assigned to the assignee hereof. As illustrated, the sorters 10 and 12 may be provided respectively with input terminals 18 and 22 and output terminals 20 and 24. Each of the sorters 10 and 12 functions as a detector which responds to a pulse train of a predetermined PRF to produce a series of output pulses in substantial coincidence therewith. The output pulses of each of the sorters 10 and 12 are thus generated on a pulse-by-pulse basis with the input pulses of the pulse train detected by that sorter.

In one embodiment each of the sorters 10 and 12 may have an internal clock operating at a frequency controlled by a voltage applied to a PRF adjustment terminal T.

The output pulses from each of the sorters 10 and 12 may be positive going pulses or negative going pulses, and desirably have a duration slightly longer than the duration of the input pulses. In a preferred embodiment the output pulses produced by each of the sorters are 5% longer in duration than the input pulses.

A composite signal comprised of pulse trains having varying pulse repetition frequencies may be applied by way of an input terminal 33 to a pulse shaping circuit 34 of conventional design to provide pulses of uniform duration and amplitude. Pulse shaping may, for example, be accomplished by the use of a conventional monostable or one-shot multivibrator triggered by each incoming pulse to revert to the stable state thereof at a predetermined time thereafter.

The shaped composite signal may be applied to the input terminal 18 of the sorter 10 which provides an output signal if the selected PRF is detected. The output signal from the sorter 10 is applied to one input terminal of a two input terminal NAND gate 36 to which an indicator lock out signal may also be applied via the other input terminal thereof. The output signal from the NAND gate 36 may be utilized to energize a suitable conventional indicator 38 via a suitable conventional driver circuit 40.

The output terminal 20 of the sorter 10 may also be connected to one terminal of a two input terminal AND gate 42 to which the shaped composite signal from the pulse shaper 34 may be applied via a suitable conventional delay circuit 41. The time delay afforded by the delay circuit 41 may be equal to the time necessary for the sorter 10 to provide an output pulse in response to an input pulse of the appropriate PRF. The output terminal of the AND gate 42 may be connected to the input terminal 22 of the sorter 12.

The output terminal 24 of the sorter 12 is connected to one input terminal of a two input terminal NAND gate 44 to which a "lock out" signal may be applied by way of the other input terminal. The output terminal of the NAND gate 44 is connected to a suitable conventional indicator 46 by way of a suitable conventional driver circuit 48.

The NAND gates, driver circuits and indicators associated with the various sorters may be identical and together comprise a module as indicated by dashed lines. Similar modules may be added as desired and as illustrated in the drawing to correspond to the number of PRF detectors desired.

The input terminal 22 of the sorter 12 may also be connected through a delay circuit 50 to one input terminal of a two input terminal AND gate 52. The output terminal 24 of the sorter 12 may similarly be connected to the other input terminal of the AND gate 52. The time delay afforded by the delay circuit 50 may be equal to that of the sorter 12 in generating an output pulse at the output terminal 24.

An output terminal of the AND gate 52 may be connected to an input terminal of a subsequent module as may be desired.

Figure 2:
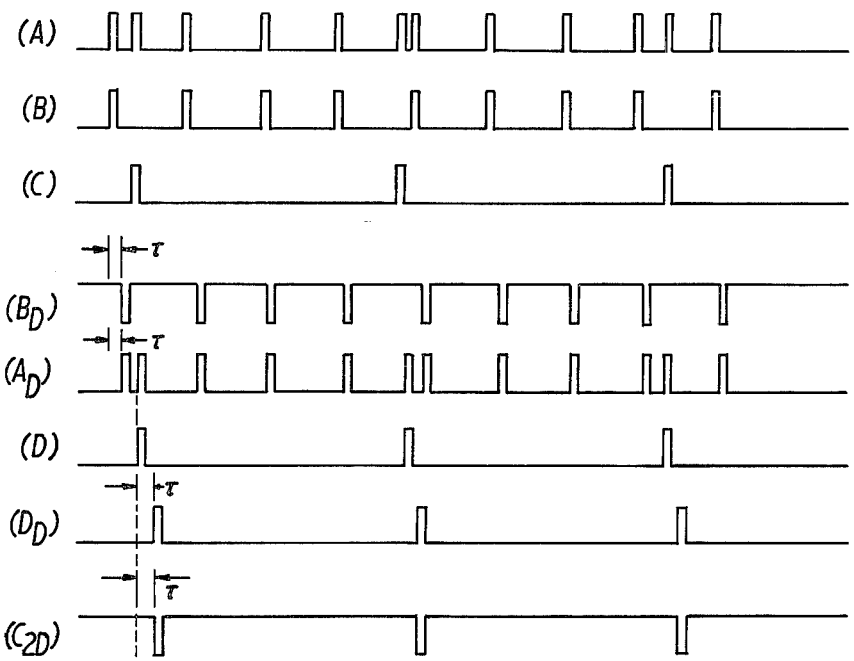

In operation and with reference to both FIGS. 1 and 2, a multiple pulse train composite input signal may be applied from signal detection apparatus (not shown) to the pulse shaping circuit 34. The shaped composite signal from the pulse shaping circuit 34 may have a waveform similar to that illustrated by the waveform (A) of FIG. 2 and may, for example, include a pulse train illustrated as waveform (B) in FIG. 2 and a pulse train illustrated as waveform (C) in FIG. 2. The pulse train waveform (B) is illustrated as having a pulse repetition frequency which is higher than the pulse repetition frequency of the pulse train waveform (C), although there may be no other special relationship between the waveforms.

The composite signal of waveform (A) may be applied to the input terminal 18 of the sorter 10. If the sorter 10 is set to respond to pulse trains having a PRF corresponding to that of the signal of waveform (B), a pulse train such as that illustrated by the waveform ($B_D$) of FIG. 2 is provided at the output terminal 20 of the sorter 10. In the preferred embodiment, waveform ($B_D$) corresponds pulse for pulse with waveform (B) with the exception of polarity and the delay inherent in the sorter 10. The negative going output signal from the sorter 10 will be passed by the associated NAND gate 36 in the absence of a "lock out" signal to effect energization of the associated indicator 38 thereby to indicate the detection of a signal of that PRF.

As illustrated in FIG. 1, the signal illustrated as waveform ($B_D$) may be applied from the sorter 10 to one of the input terminals of the AND gate 42. Simultaneously therewith, the signal illustrated as waveform ($A_D$) in FIG. 2 is applied to the other input terminal. The delay $\tau$ introduced in the signal (A) by the delay circuit 41 is desirably the same as the inherent delay $\tau$ introduced in waveform (B) by the sorter 10. This $\tau$ delay may, however, be very short and thus negligible, in which event the delay circuit 41 may be eliminated.

The operation of the AND gate 42 is such that the coincidence of the pulses of waveform ($A_D$) and ($B_D$) inhibits the passage of the pulses of waveform ($A_D$). As can be readily appreciated, the resulting signal at the output terminal of the AND gate 42 may be as illustrated in waveform (D), i.e., a delayed pulse train corresponding to the composite signal of waveform (A) with pulses from the pulse train of waveform (B) removed therefrom.

Waveform (D) may then be applied to the input terminal 22 of the sorter 12. Since the waveform (D) contains the delayed pulse train of waveform (C), the sorter 12 will generate an output signal illustrated as waveform ($C_{2D}$) in FIG. 2, i.e., the waveform (C) delayed by the delay circuit 41 and by the sorter 12. This waveform may be applied through the associated NAND gate 44, in the absence of a lock out signal, to effect energization of the associated indicator 46. Waveform ($C_{2D}$) is desirably negative in polarity so that the application thereof to the AND gate 52 simultaneously with the waveform (D) as delayed by a time $\tau$ by the delay circuit 50, i.e., the waveform ($D_D$), eliminates the pulses of waveform (C) therefrom.

Since the composite waveform (A) in the illustrated example contains only waveform (B) and waveform (C), no pulses will be passed through the AND gate 52 to subsequent sorters.

A system has thus been provided for indicating the existence of pulse trains of predetermined PRF's in which a plurality of independent PRF detecting means are provided with means for indicating the detection. The composite signal is applied sequentially to each of the detecting means in turn with signals having previously detected PRF's removed therefrom.

The PRF to which the individual detecting means respond need not be in descending order if the detection of a signal at the fundamental frequency thereof and its lower frequency harmonics is not a problem.

If the signal having the PRF to which the detecting means is tuned is not present in the composite signal, the composite signal will be delayed and transmitted to the next subsequent one of the detecting means.

The gating of the output signal from each of the PRF detectors to an indicator has been found desirable since the indicator may be inhibited in dense environments where many "friendly" radars are operating to reduce operator distraction. The passband of the individual PRF detectors may be relatively narrow so that the detection of a pulse train will not mask the detection of a pulse train having a PRF near thereto. Typically, the band pass of the PRF detector may be ±6% of the center frequency to which the detector is tuned with band edge overlap.

Another important feature is the independent clocking of each PRF detector so that cross-talk is eliminated. The individual PRF detector modules may be identical and may be programmed externally by the remote adjustment of individual voltage controlled clocks. This repetitiveness assures low cost and simplicity of maintenance.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A system for detecting the pulse repetition frequencies of a plurality of signals received as a composite signal comprising:
   a plurality of individually tuned pulse repetition frequency detectors each having means for indicating the detection of the pulse repetition frequency to which it is tuned; and,
   circuit means for sequentially applying the composite signal to said plurality of detectors,
   said circuit means including means for blocking from the composite signal applied to an nth detector, pulse repetition frequency signals detected in a previous detector.

2. The system of claim 1 including means for inhibiting the indication of the detection of selected pulse repetition frequencies.

3. The system of claim 1 wherein said circuit means includes means for delaying the application of the composite signal to successive detectors by an amount of time substantially equal to the processing of the composite signal by previous detectors.

4. The system of claim 3 including means for inhibiting the indication of the detection of selected pulse repetition frequencies.

5. A system for detecting the pulse repetition frequency of a pulse train in a composite signal including pulse trains having different pulse repetition frequencies comprising:
   first detector means for providing a pulse for every pulse in a pulse train having a first predetermined pulse repetition frequency;
   means for applying said composite signal to said first detecting means;
   first gate means for removing from the composite signal those pulses at said first predetermined pulse repetition frequency to which said first detector means is responsive, thereby to provide a second composite signal excluding said first predetermined pulse repetition frequency;
   second detector means for providing a pulse for every pulse in a pulse train having a second predetermined pulse repetition frequency; and,
   means for applying said second composite signal to said second detector means.

6. The system of claim 5 wherein said first gate means includes means for delaying the composite signal for a time interval related to the time required for said first detector means to provide a pulse in response to a pulse in the composite signal.

7. The system of claim 6 wherein said first predetermined pulse repetition frequency is higher than said second predetermined pulse repetition frequency.

8. The system of claim 7 wherein said first and second detector means include means for selectively indicating the detection of the pulse repetition frequency to which said detector means is tuned.

9. A method of detecting the PRF of pulse signals within a plurality of PRF pulse signals received as a composite signal comprising the steps of:
   a. providing a plurality of individually adjustable PRF detectors;
   b. detecting in the composite signal by a first one of the PRF detectors a signal having a predetermined PRF;
   c. blanking from the composite signal on a pulse-by-pulse basis the pulses in the signal detected by the first one of the PRF detectors to thereby provide a first signal; and
   d. detecting in the first signal by a second one of the PRF detectors a signal having a predetermined PRF.

10. A method comprising the steps of:
   a. receiving an input signal;
   b. examining the received signal for a signal having a first selected PRF;
   c. blanking from the received signal, in response to the detection, in the examined signal of a signal having the first selected PRF, the detected signal to provide a first signal; and
   d. examining the first signal for a signal having a second selected PRF.

11. The method of claim 10 including the steps of selectively indicating the detection of a signal having a selected PRF.